US009190201B2

(12) United States Patent
Li et al.

(10) Patent No.: US 9,190,201 B2
(45) Date of Patent: Nov. 17, 2015

(54) MAGNETIC FILM ENHANCED INDUCTOR

(75) Inventors: Xia Li, San Diego, CA (US); Matthew Nowak, San Diego, CA (US); Seung H. Kang, San Diego, CA (US); Brian Matthew Henderson, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/397,488

(22) Filed: Mar. 4, 2009

(65) Prior Publication Data

US 2010/0225435 A1 Sep. 9, 2010

(51) Int. Cl.
H01F 5/00 (2006.01)
H01F 27/28 (2006.01)
H01F 17/00 (2006.01)
H01F 41/04 (2006.01)
H01F 41/14 (2006.01)
H01L 23/522 (2006.01)

(52) U.S. Cl.
CPC .......... *H01F 17/0006* (2013.01); *H01F 41/046* (2013.01); *H01F 41/14* (2013.01); *H01L 23/5227* (2013.01); *H01F 2017/0053* (2013.01); *H01F 2017/0066* (2013.01); *H01L 2924/0002* (2013.01)

(58) Field of Classification Search
CPC .......... H01F 41/046; H01F 2017/0053; H01F 2017/0066
USPC .......................................................... 336/200
See application file for complete search history.

(56) References Cited

U.S. PATENT DOCUMENTS

| 5,884,990 | A  | * | 3/1999  | Burghartz et al. ............ 336/200 |
| 6,114,937 | A  |   | 9/2000  | Burghartz |
| 6,166,422 | A  |   | 12/2000 | Qian |
| 6,417,755 | B1 |   | 7/2002  | Liu |
| 2004/0195647 | A1 |   | 10/2004 | Crawford |
| 2005/0275497 | A1 |   | 12/2005 | Ramadan |
| 2006/0022787 | A1 |   | 2/2006  | Brennan et al. |
| 2008/0001699 | A1 |   | 1/2008  | Gardner |
| 2008/0238601 | A1 | * | 10/2008 | Das et al. ...................... 336/200 |
| 2009/0039999 | A1 | * | 2/2009  | Fujii et al. ..................... 336/200 |

(Continued)

FOREIGN PATENT DOCUMENTS

| JP | S3925377   | 8/1939 |
| JP | H05135950 A | 6/1993 |
| JP | H0729732 A  | 1/1995 |

(Continued)

OTHER PUBLICATIONS

Enlgsih Translation of JP2000150238A.*

(Continued)

*Primary Examiner* — Elvin G Enad
*Assistant Examiner* — Ronald Hinson
(74) *Attorney, Agent, or Firm* — Michelle S. Gallardo

(57) ABSTRACT

An integrated magnetic film enhanced inductor and a method of forming an integrated magnetic film enhanced inductor are disclosed. The integrated magnetic film enhanced inductor includes an inductor metal having a first portion and a second portion, a top metal or bottom metal coupled to the inductor metal, and an isolation film disposed one of in, on, and adjacent to at least one of the first portion and the second portion of the inductor metal. The isolation film includes a magnetic material, such as a magnetic film.

25 Claims, 6 Drawing Sheets

(56) References Cited

U.S. PATENT DOCUMENTS

2009/0045899 A1* 2/2009 Masai et al. ................ 336/172
2009/0251267 A1 10/2009 Jeon et al.

FOREIGN PATENT DOCUMENTS

| | | |
|---|---|---|
| JP | H08124745 A | 5/1996 |
| JP | 2000150238 A | 5/2000 |
| JP | 2001284533 A | 10/2001 |
| JP | 2006013111 A | 1/2006 |
| JP | 2006302992 A | 11/2006 |
| JP | 2006319094 A | 11/2006 |
| JP | 2008193059 A | 8/2008 |
| WO | 2004112138 A1 | 12/2004 |

OTHER PUBLICATIONS

International Search Report—PCT/US2010/026246, International Search Authority—European Patent Office Jun. 28, 2010.
Written Opinion—PCT/US2010/026246, International Search Authority—European Patent Office Jun. 28, 2010.

* cited by examiner

MAGNETIC FILM ENHANCED INDUCTOR

FIELD OF DISCLOSURE

The disclosed embodiments are related to inductors, and methods of forming inductors. More particularly, the embodiments are related to integrated magnetic film enhanced inductors, and methods of forming integrated magnetic film enhanced inductors.

BACKGROUND

Inductance (measured in henries H) is an effect which results from the magnetic field that forms around a current-carrying conductor. The electrical current through the conductor creates a magnetic flux proportional to the current. A change in this current creates a change in the magnetic flux that, in turn, generates an electromotive force (EMF) that acts to oppose this change in current. Inductance is a measure of the generated EMF for a unit change in current. The number of turns, the area of each loop/turn, and what it is wrapped around affect the inductance. For example, the magnetic flux linking these turns can be increased by coiling the conductor around a material with a high permeability.

The energy stored by an inductor is equal to the amount of work required to establish the current flowing through the inductor, and therefore the magnetic field. This is given by:

$$E_{stored} = \frac{1}{2}LI^2$$

where:
L is the inductance; and
I is the current flowing through the inductor.

An inductor is commonly constructed as a coil of conducting material, such as copper wire, wrapped around a core either of air or of a magnetic material. Core materials with a higher permeability than air confine the magnetic field closely to the inductor, thereby increasing the inductance. Inductors come in many shapes. For example, many common inductors are constructed as enamel coated wire wrapped around a ferrite bobbin with wire exposed on the outside, while some enclose the wire completely in ferrite and are called "shielded". Some inductors have an adjustable core, which enables changing of the inductance. Inductors that can be used to block very high frequencies are sometimes made with a wire passing through a ferrite cylinder or bead. Small inductors can be etched directly onto a printed circuit board by laying out a trace in a spiral pattern. Small value inductors also can be built on integrated circuits using the same or similar processes that are used to make transistors. In these cases, aluminum interconnect is commonly used as the conducting material.

The Q factor of an inductor can be found through the following formula, where R is its internal electrical resistance:

$$Q = \frac{\omega L}{R}$$

By using a magnetic core, the inductance is increased for the same amount of copper, raising the Q. The cores, however, also introduce losses that increase with the frequency. A grade of core material is chosen for best results for the frequency band.

A basic inductance formula for a cylindrical coil is:

$$L = \frac{\mu_0 \mu_r N^2 A}{l}$$

where:
L=Inductance in henries (H);
μ0=permeability of free space=$4\pi \times 10^{-7}$ H/m;
μr=relative permeability of core material;
N=number of turns;
A=area of cross-section of the coil in square meters (m²); and
l=length of coil in meters (m).

Inductors are used extensively in analog circuits and signal processing. Inductors in conjunction with capacitors and other components can be used to form tuned circuits that can emphasize or filter out specific signal frequencies. Smaller inductor/capacitor combinations can provide tuned circuits that can be used in radio reception and broadcasting. For analog/RF and system on chip (SOC) applications, inductors can be required to be a basic element.

FIGS. 1 and 2 show a conventional serpent type inductor having an inductor metal 110 coupled to bottom metal 112 by a via interconnect 114. As shown in the cross-sectional illustration in FIG. 2, a cap film 120 is formed on an inter layer dielectric (ILD) 122. The inductor metal 110 is formed on the cap film 120. The conventional inductor commonly uses an oxide or a low-k oxide as an isolation film 108 and/or a high-k cap film 120.

SUMMARY

The disclosed embodiments are directed to inductors, and methods of forming inductors. More particularly, the embodiments are related to integrated magnetic film enhanced inductors, and methods of forming integrated magnetic film enhanced inductors.

For example, an illustrative embodiment is directed to an integrated magnetic film enhanced inductor including an inductor metal having a first portion and a second portion, and an isolation film disposed one of in, on, and adjacent to at least one of the first portion and the second portion of the inductor metal, wherein the isolation film includes a magnetic material.

In another embodiment, an inductor can include a substrate, an inductor metal having a plurality of turns formed on the substrate, and a magnetic material one of in, on, and adjacent to a portion of the inductor metal.

Another embodiment is directed to a method of forming an integrated magnetic film enhanced inductor. The method can include depositing and patterning an inductor metal having a first portion and a second portion, and depositing and patterning a magnetic material one of in, on, and adjacent to at least one of the first portion and the second portion of the inductor metal.

Another embodiment is directed to a method of forming an integrated magnetic film enhanced inductor. The method can include depositing and patterning a bottom metal using a metal deposit/photo/etching process, depositing a first inter layer dielectric (ILD) on the first metal and performing a chemical mechanical planarization (CMP) process on the inter layer dielectric, depositing a bottom cap film on the first inter layer dielectric (ILD), depositing an inductor metal on the bottom cap film and patterning the inductor metal using a photo/etching process, depositing a top cap film above the inductor metal and performing a chemical mechanical planarization (CMP) process on the top cap film, performing a photo/etching process to the top cap film to form a hole one of in, on, and adjacent to a first portion of the inductor metal, depositing a magnetic material over the top cap film and the hole and etching the magnetic material back to a top of the top cap film such that the magnetic material is one of in, on, and adjacent to the first portion of the inductor metal, depositing a second inter layer dielectric (ILD) above the magnetic material and performing a chemical mechanical planarization (CMP) process on the second inter layer dielectric (ILD), and performing a vertical magnetic anneal to align a magnetic field axis of the inductor along an easy axis of the magnetic material.

Yet another embodiment is directed to a method of forming an integrated magnetic film enhanced inductor. The method can include depositing and patterning a bottom metal using a dual damascene process, depositing a first inter layer dielectric (ILD) on the first metal, depositing a bottom cap film on the first inter layer dielectric (ILD), depositing a second inter layer dielectric (ILD) on the bottom cap film, forming a trench in the second inter layer dielectric (ILD) using photolithography and etching techniques, plating a copper layer over at least the trench and polishing the copper layer down to the surface of the second inter layer dielectric (ILD) to form an inductor metal, depositing a top cap film above the second inter layer dielectric (ILD) and the inductor metal and polishing the top cap film, forming a hole in the top cap film and the second inter layer dielectric (ILD) using photolithography and etching techniques, depositing a magnetic material layer over at least the hole, depositing a third inter layer dielectric (ILD) above the magnetic material and performing a chemical mechanical planarization (CMP) process on the third inter layer dielectric (ILD), and performing a magnetic anneal to align a magnetic field axis of the inductor along an easy axis of the magnetic material.

Another embodiment is directed to an inductor comprising inductive means for generating a magnetic field, the inductive means having a first portion and a second portion, and isolating means for magnetically isolating at least one of the first portion and the second portion of the inductive means, the isolating means disposed one of in, on, and adjacent to the at least one of the first portion and the second portion of the inductive means, wherein the isolation means includes a magnetic material.

Another embodiment is directed to a method of forming an inductor. The method can comprise a step for forming an inductor metal having a first portion and a second portion, and a step for forming a magnetic material one of in, on, and adjacent to at least one of the first portion and the second portion of the inductor metal.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Aspects of the embodiments are disclosed in the following description and related drawings directed to such embodiments. Alternate embodiments may be devised without departing from the scope of the invention. Additionally, well-known elements used and applied in the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
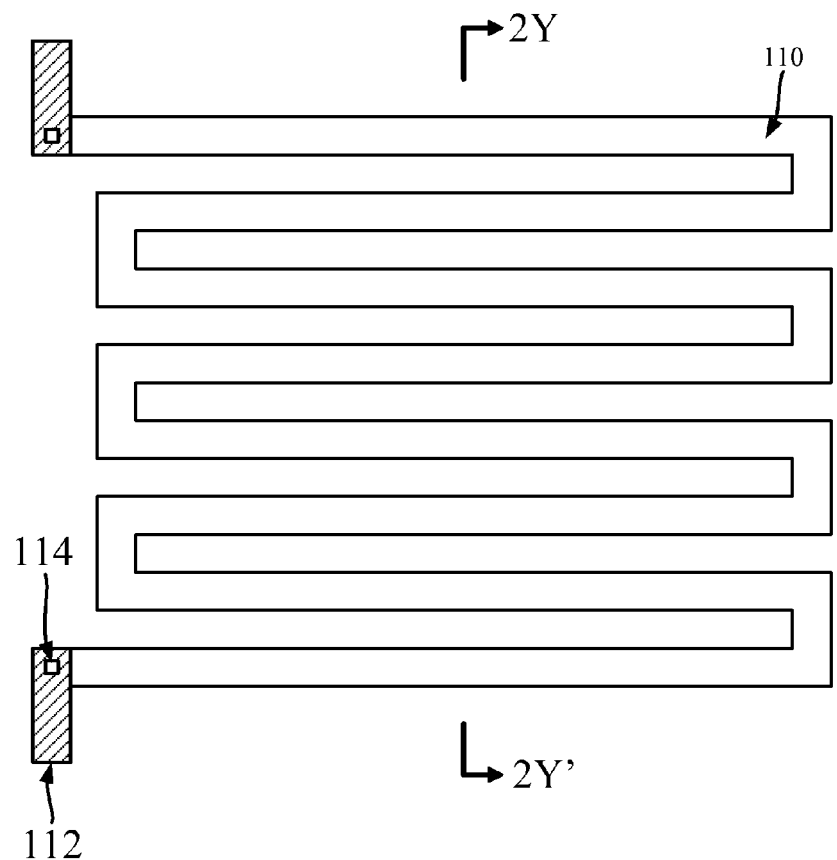
FIG. 1 is a top view of a conventional serpent type inductor.
Figure 2:
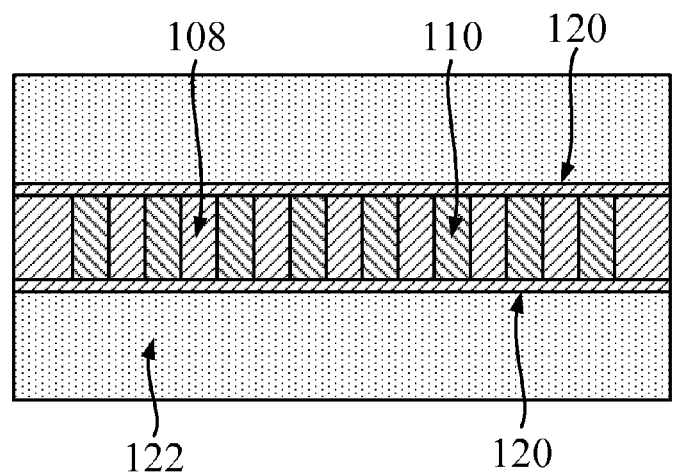
FIG. 2 is a cross-sectional view taken along line 2Y-2Y' in FIG. 1.

As shown in FIG. 2, the conventional inductor commonly uses an oxide or a low-k oxide as an isolation film 108 and/or a high-k cap film 120.

For semiconductor integration, the disclosed embodiments recognize that a magnetic material, such as a magnetic film (e.g., a ferromagnetic film such as CoFe, CoFeB, or NiFe, etc.), can be implemented into, along, or adjacent to a surface of the inductor metal, such as a sidewall of a wire of the inductor, to increase the inductance value and/or reduce the size of the inductor. According to the disclosed exemplary embodiments, a plurality of magnetic film strips can fill into, on, or adjacent to the inductor wire sidewall to form a magnetic field along a vertical direction. The magnetic film's permeability is much higher than the permeability of oxide or a vacuum. Accordingly, the inductance of the magnetic film enhanced inductor is greatly increased compared to the inductance of a conventional oxide filled inductor. The magnetic film strips can be formed to be small and thin in size. The magnetic film strips can have a high resistivity. The embodiments can reduce the skin effect and the eddy current effect in the magnetic film strips. The magnetic film strips can be patterned to be shape anisotropic to enhance the magnetic field along with the long axis (i.e., the easy axis) of the magnetic film strips. The magnetic film strips can help to improve the inductance and the Q value. The wire metal can be aluminum or copper or other higher conductive metal. Copper or higher conductive metal is effective for increasing the Q value further by reducing the series resistance. The size of the magnetic film enhanced inductor can be reduced in analog/RF or SOC applications, for example, if a fixed inductance value is required.

With reference to FIGS. 3-8, exemplary embodiments of an integrated magnetic film enhanced inductor, and methods of forming integrated magnetic film enhanced inductor, will now be described.

For semiconductor integration, a magnetic material, such as a magnetic film, can be implemented into a sidewall of a wire of the inductor to increase the inductance value and/or reduce the size of the inductor. According to the disclosed exemplary embodiments, a plurality of magnetic film strips can fill into, on, or adjacent to a surface of the inductor metal, such as the inductor wire sidewall, to form a magnetic field along a vertical direction. The permeability of the magnetic film is much higher than the permeability of oxide or a vacuum. Accordingly, the inductance of the magnetic film enhanced inductor is greatly increased compared to the inductance of a conventional oxide filled inductor. The magnetic film strips can be formed to be small and thin in size. The magnetic film strips can have a high resistivity. The embodiments can reduce the skin effect and the eddy current effect in the magnetic film strips. The magnetic film strips can be patterned to be shape anisotropic to enhance the magnetic field along with the long axis (i.e., the easy axis) of the magnetic film strips. The magnetic film strips can help to improve the inductance and the Q value. The wire metal can be aluminum or copper or other higher conductive metal. Copper or higher conductive metal is effective for increasing the Q value further by reducing the series resistance. The size of the magnetic film enhanced inductor can be reduced in analog/RF or SOC applications, for example, if a fixed inductance value is required.

Figure 3:
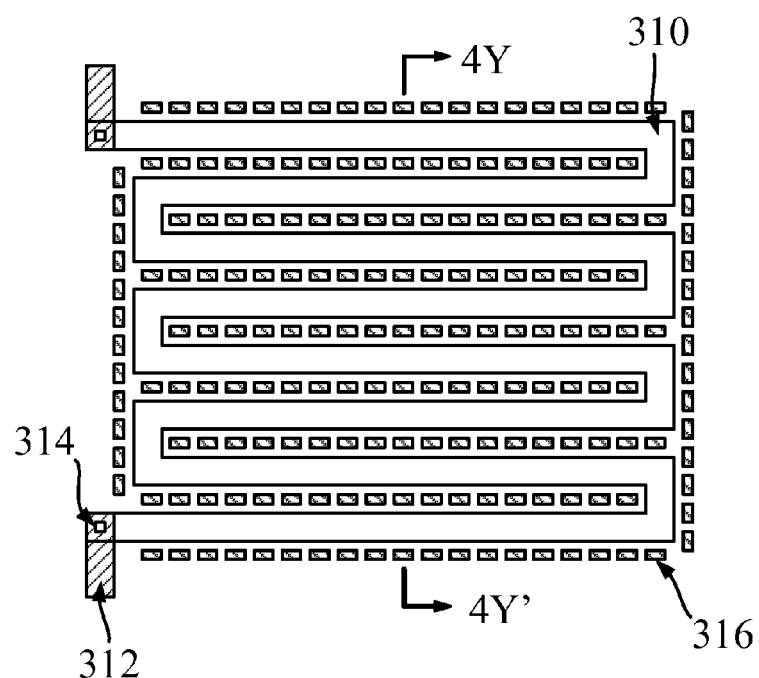
FIG. 3 is a top view of a serpent type magnetic film enhanced inductor.
Figure 4:
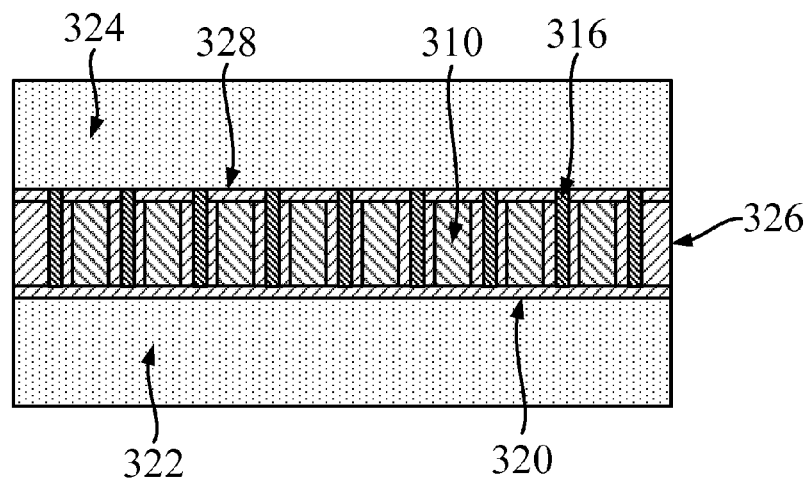
FIG. 4 is a cross-sectional view taken along line 4Y-4Y' in FIG. 3.

As shown in FIGS. 3 and 4, a serpent type magnetic film enhanced inductor according to an exemplary embodiment can include a serpent type inductor metal 310 connected to a bottom metal 312 by a via interconnect 314. In another embodiment, the metal 310 can be coupled or connected to another circuit without using the bottom metal 312 and the via 314. In the disclosed embodiment, a magnetic material, such as a magnetic film 316, can be implemented into, on, or adjacent to a surface of the inductor metal 310, such as a sidewall of the wire of the inductor metal 310, to increase the inductance value and/or reduce the size of the inductor. In the disclosed embodiment, the magnetic material 316 can be implemented into, on, or adjacent to a portion of the inductor, such as an outermost or end portion of the inductor. Additionally or alternatively, the magnetic material 316 can be inserted, for example, as a strip into one or more spaces between a first portion of the inductor metal 310 and a second portion of the inductor metal 310.

As shown in the cross-sectional illustration in FIG. 4, a cap film 320 is formed on an inter layer dielectric (ILD) 322. The inductor metal 310 is formed on the cap film 320. In an aspect of the disclosed embodiment, the magnetic film 316 can be disposed on or adjacent to the inductor metal 310. In another aspect, the magnetic film 316 can be disposed in the spaces between the inductor metal 310. That is, the magnetic film 316 can interpose portions of the inductor metal 310.

With reference again to FIGS. 3 and 4, the inductor metal 310 (i.e., inductor wire) is coated by the cap film 320, which can be an isolation film, such as SiC or SiN or other isolation material. The thickness of the cap film 320 can be selected to maintain a sufficient isolation margin. The cap film 320 generally may not fill the whole space between a first portion of the inductor metal 310 (i.e., inductor wire) and a second portion (e.g., an adjacent portion) of the inductor metal 310. The seams of the cap film 320 between the first and second portions of the inductor metal 310 can be filled by oxide. By using an oxide etch back and photo/etch technique, holes can be formed in the sidewalls of the cap film 320 for receiving the magnetic stripes. The magnetic film 316 can be deposited into the holes in the side walls of the cap film 320. The magnetic film 316 then can be etched or removed by performing, for example, a chemical mechanical planarization (CMP) process. Next, the ILD 322 and the via/metal process can be applied to form, for example, a via interconnect and metal layer. The inductors can be connected by the same layer metal wire, or by a bottom metal layer (i.e., wire) and top layer metal layer (i.e., wire) by a via interconnect. As shown in FIG. 3, a serpent inductor can be connected by a bottom metal wire. Accordingly, the disclosed embodiments of inductors can be easily implemented to a logic process with limited additional steps.

As explained above, the permeability of the magnetic film 316 is much higher than the permeability of oxide or a vacuum. Accordingly, the inductance of the magnetic film enhanced inductor is greatly increased compared to the inductance of a conventional oxide filled inductor. By using the magnetic film 316 instead of an oxide as the isolation film, the permeability can be increased, and the size of the magnetic film enhanced inductor can be reduced.

The wire metal can be aluminum or copper or other higher conductive metal. Copper or higher conductive metal is effective for increasing the Q value further by reducing the series resistance. The size of the magnetic film enhanced inductor can be reduced in analog/RF or SOC applications, for example, if a fixed inductance value is required.

Figure 5:
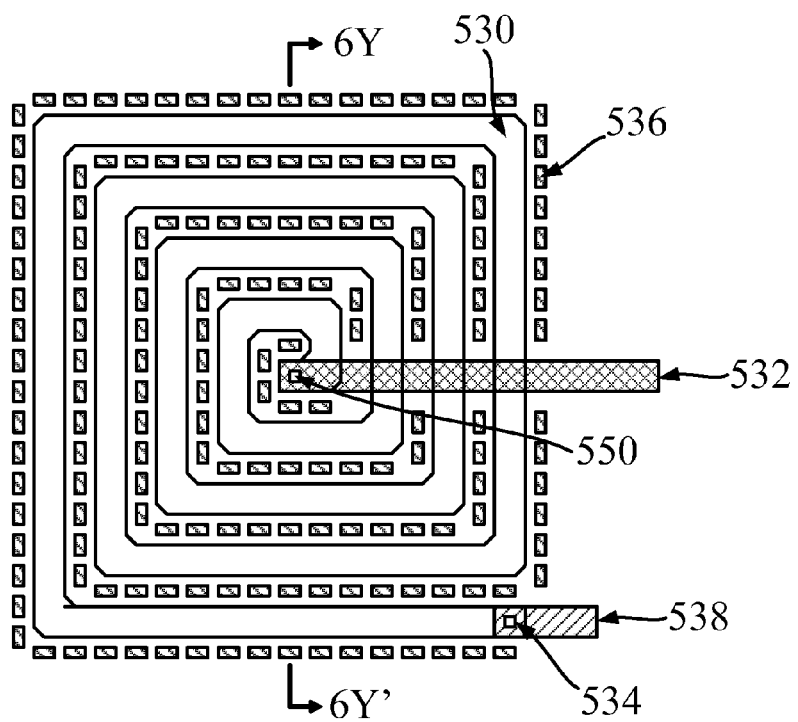
FIG. 5 is a top view of a circular type magnetic film enhanced inductor.
Figure 6:
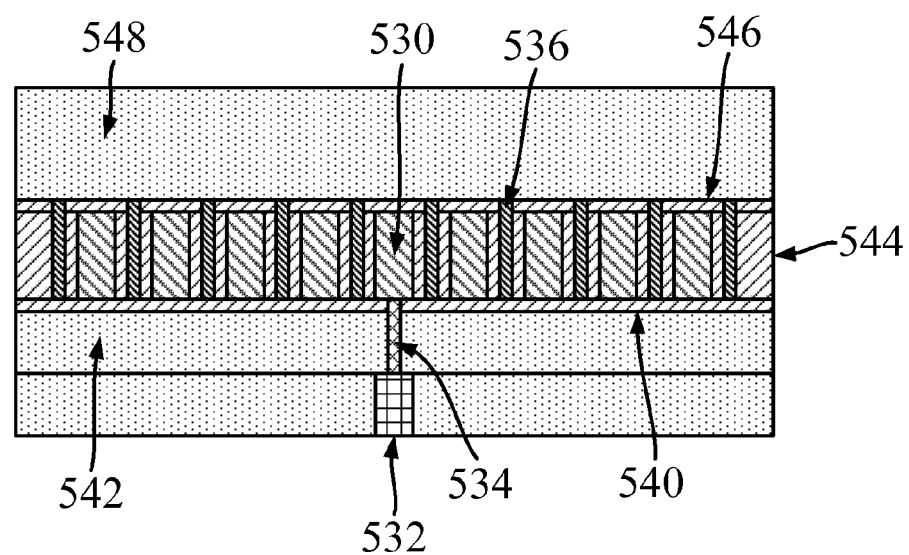
FIG. 6 is a cross-sectional view taken along line 6Y-6Y' in FIG. 5.

As shown in FIGS. 5 and 6, a circular type magnetic film enhanced inductor according to an exemplary embodiment can include a circular type inductor metal 530 coupled or connected to a top metal 538 and bottom metal 532. In another embodiment, the metal 530 can be coupled or connected to another circuit without a top metal 538 and/or bottom metal 532. As shown in the cross-sectional illustration in FIG. 6, a bottom cap film 540 is formed on an inter layer dielectric (ILD) 542. The inductor metal 530 and dielectric 544 are formed on the cap film 540. A top cap film 546 is formed over the inductor metal 530 and dielectric 544. A via 534 couples or connects the bottom metal 532 to the inductor metal 530.

In an aspect of the disclosed embodiment, the magnetic film 316 can be disposed on or adjacent to the inductor metal 310. In another aspect, the magnetic film 316 can be disposed in the spaces between the inductor metal 310. That is, the magnetic film 316 can interpose portions of the inductor metal 310.

In the disclosed embodiment, a magnetic material, such as a magnetic film 536, can be implemented into, on, or adjacent to a surface of the inductor metal 530, such as a sidewall of the wire of the inductor metal 530, to increase the inductance value and/or reduce the size of the inductor. In the disclosed embodiment, the magnetic material 536 can be implemented into, on, or adjacent to a portion of the inductor, such as an outermost or end portion of the inductor. Additionally or alternatively, the magnetic material 536 can be inserted, for example, as a strip into one or more spaces between the inductor metal 530. That is, in such an embodiment, the magnetic film 536 can interpose portions of the inductor metal 530.

With reference again to FIG. 6, the inductor metal 530 (i.e., inductor wire) is coated by the cap film 546, which can be an isolation film, such as SiC or SiN or other isolation material. The thickness of the cap film 546 can be selected to maintain a sufficient isolation margin. The cap film 546 generally may not fill the whole space between a first portion of the inductor metal 530 (i.e., inductor wire) and a second portion (i.e., an adjacent portion) of the inductor metal 530. The seams of the cap film 546 between the first and second portions of the inductor metal 530 can be filled by oxide. By using, for example, an oxide etch back and photo/etch technique, holes can be formed in side walls of the cap film 546 for receiving the magnetic film 536. The magnetic film 536 can be deposited into the holes in the side walls of the cap film 546. The magnetic film 536 then can be etched or removed, for example, by performing a chemical mechanical planarization (CMP) process. Next, the ILD 548 and a via/metal process can be applied to form, for example, a via interconnect 550 and top metal layer. The inductors can be connected by the same layer metal wire, or by a bottom metal layer (i.e., wire) and top layer metal layer (i.e., wire) by a via interconnect. As shown in FIG. 5, a circular inductor can be connected by a top metal wire 538 and a bottom metal wire 532. Accordingly, the disclosed embodiments of inductors can be easily implemented to a logic process with limited additional steps.

By using the magnetic film 536 instead of an oxide as the isolation film, the permeability can be increased, and the size of the magnetic film enhanced inductor can be reduced in analog/RF or SOC applications.

The inductor wire metal can be aluminum or copper or other higher conductive metal. Copper or higher conductive metal is effective for increasing the Q value further by reducing the series resistance. The size of the magnetic film enhanced inductor can be reduced in analog/RF or SOC applications, for example, if a fixed inductance value is required.

With reference to FIGS. 4, 6, 7, and 8, exemplary methods of forming an integrated magnetic film enhanced inductor will now be described.

Figure 7:
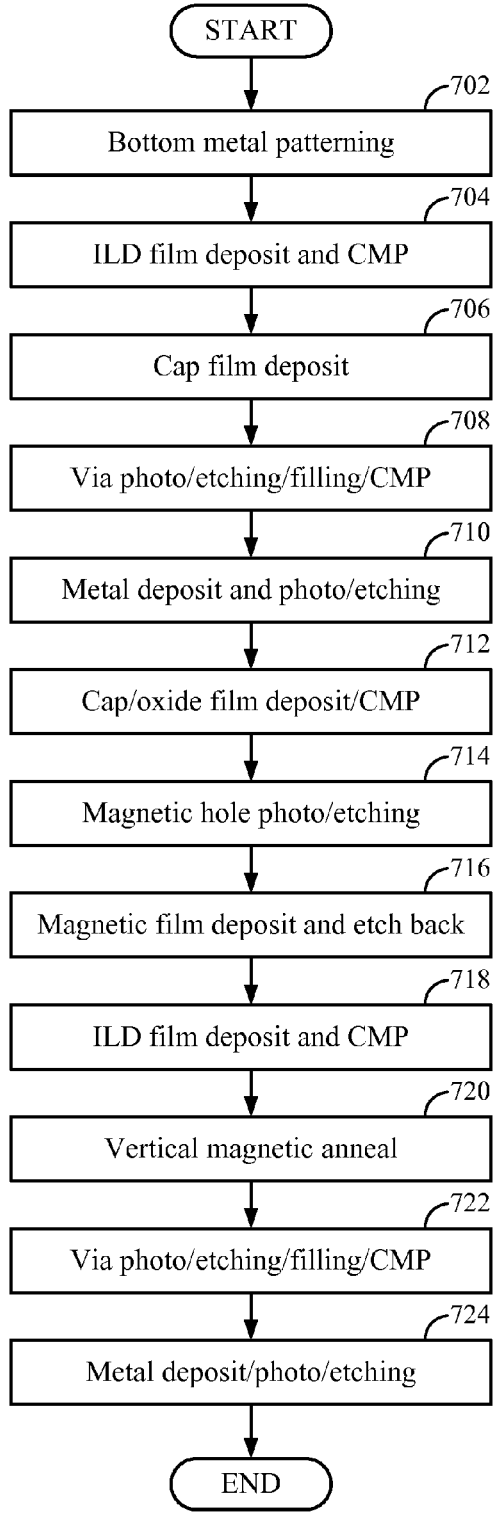
FIG. 7 is a flow diagram illustrating a method of forming an inductor.

As illustrated in FIG. 7, an exemplary method of forming an integrated magnetic film enhanced inductor can include depositing and patterning a first metal, such as a bottom metal 312, 532 by performing a metal deposit/photo/etching process (e.g., 702). Next, an inter layer dielectric (ILD) 322, 542 can be deposited and a CMP process can be applied (e.g., 704). A bottom cap film 320, 540 can be deposited on the ILD 322, 542 (e.g., 706). In the embodiment illustrated, for example, in FIG. 6, a via photo/etching/filling/CMP process can be applied to form a via 534 (e.g., 708). An inductor metal 310, 530 is deposited and patterned, for example, by a photo/etching process (e.g., 710). In the embodiment illustrated, for example, in FIG. 6, the inductor metal 310, 530 can be coupled or connected to the bottom metal 312, 532 by the via interconnect 314, 534.

Next, a cap/oxide film can be deposited and a CMP process can be performed (e.g., 712). The, a photo/etching process can be applied to form holes for the magnetic film strips (e.g., 714). A magnetic material layer, such as a magnetic film 316, 536, can be deposited to form a magnetic material. The top of the magnetic material can be etched back to the top of the cap/oxide film (e.g., 716) such that the magnetic material is implemented into, on, or adjacent to a surface of the inductor metal 310, 530, such as a sidewall of the wire of the inductor metal 310, 530, and/or interposed between a first portion of the inductor metal 310, 530 and a second portion (i.e., adjacent portion) of the inductor metal 310, 530. An ILD film can be deposited and a CMP process can be performed (e.g., 718). A vertical magnetic anneal can be applied (e.g., 720). In an embodiment, a via patterning process (e.g., photo/etching process) can be performed and the via can be filled, for example, by tungsten. Then, a CMP process can be performed to remove any extra tungsten on the top surface to form a via (not shown) (e.g., 722). A metal film (not shown) can be deposited and patterned by, for example, a photo/etching process, to make a coupling or connection to the top via 550 (e.g., 724).

In another embodiment, a top metal layer also can be provided to form a top metal 538, as illustrated in FIG. 5. The inductor metal 530 can be coupled to the top metal 538 by a via interconnect 550.

Figure 8:
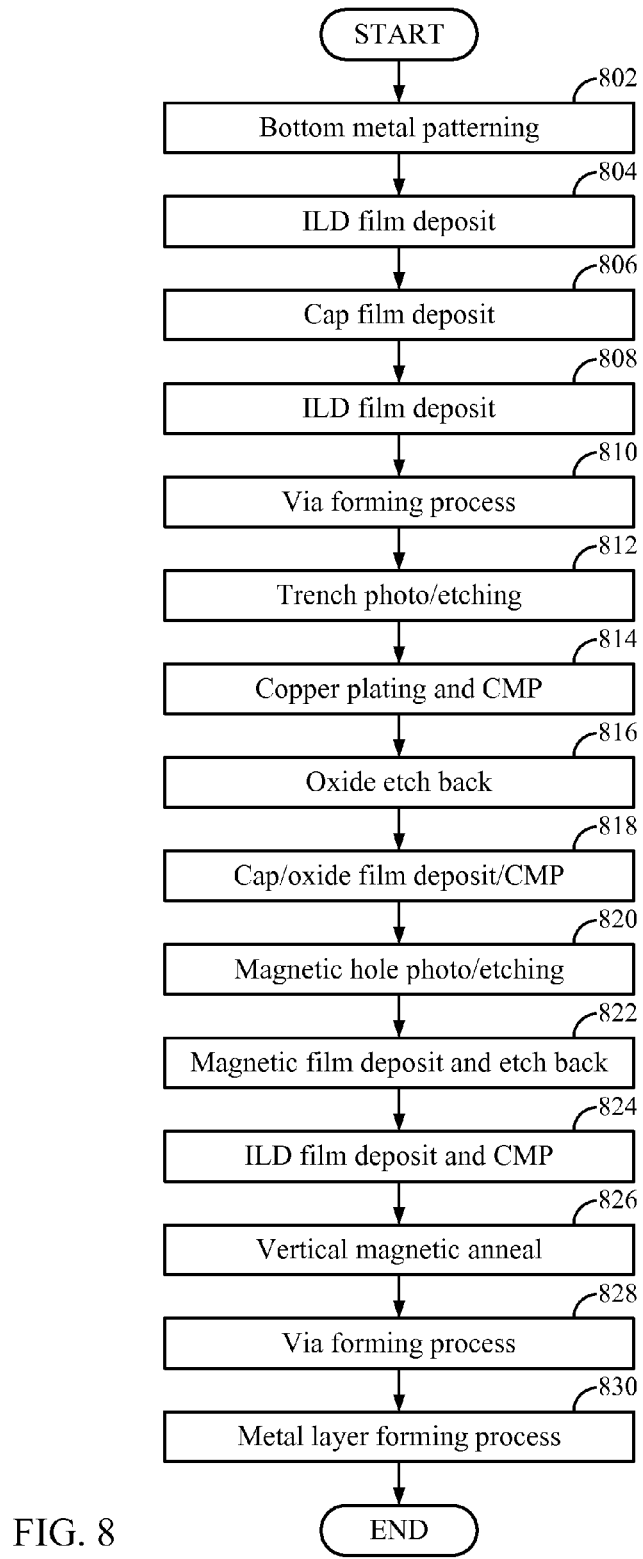
FIG. 8 is a flow diagram illustrating a method of forming an inductor.

FIG. 8 illustrates another exemplary method of forming an integrated magnetic film enhanced inductor according to a disclosed embodiment. The exemplary method can include using a dual damascene process, patterning trenches and plating copper, and performing a chemical mechanical planarization (CMP) process on the bottom metal layer to form the bottom metal 312, 532 (e.g., 802). Next, an inter layer dielectric (ILD) 322, 542 can be deposited (e.g., 804). A bottom cap film 320, 540 can be deposited on the ILD 322, 542 (e.g., 806). In an embodiment, a via opening can be formed in the ILD 542 by photo and etching process (e.g., 808) to form a via 534. An ILD film 326, 544 can be deposited on the bottom cap film 320, 540 (e.g., 810).

Next, such method can include forming trenches for the metal wire using photolithography and etching techniques (e.g., 812). The method can include plating a copper layer over at least the trenches and the vias and then polishing the copper layer down to the surface of the ILD 326, 544 using, for example, chemical mechanical planarization (CMP) techniques (e.g., 814) to form the inductor metal 310, 530. An exemplary method can include an oxide etching back process (e.g., 816). A top cap/oxide film 328, 546 can be deposited on the ILD 326, 544 and the inductor metal 310, 530, followed by polishing using, for example, chemical mechanical planarization (CMP) techniques (e.g., 818).

A plurality of holes can be formed in the top cap film 328, 546 and the ILD film 326, 544 using photolithography and etching techniques (e.g., 820). A magnetic material layer, such as a magnetic film, can be deposited over at least the etched holes, and then the magnetic material can be etched back, or a CMP process can be performed, to the surface of the top cap film 328, 546 to form the magnetic material 316, 536 (e.g., 822).

Next, an ILD film 324, 548 can be deposited over the top cap film 328, 546 and the magnetic material 316, 536, and polished using, for example, chemical mechanical planarization (CMP) techniques (e.g., 824). A vertical magnetic annealing process can be performed to align the magnetic field with the easy axis of the magnetic strips (e.g., 826).

The method can include forming a via opening in the ILD 324, 548 using, for example, a dual damascene process to form a via 550 to couple or connect the inductor metal 530 to a top metal 538 (e.g., S156). Finally, a metal layer can be plated over the ILD 548 and patterned to form the top metal 538 using, for example, a dual damascene process (e.g., 830).

With reference again to FIGS. 7 and 8, an embodiment of the cap film (e.g., 546) can be provided such that the thickness of the cap film is not enough to completely or fully fill the space between the inductor metal wires, while at the same time, the thickness of the cap film is thick enough to provide a sufficient isolation margin for circuit operation. That is, since a difference of voltage of neighboring wires of the inductor is small, the cap thickness process window can be formed to be large enough (e.g., just large enough) to prevent breakdown.

According to the disclosed exemplary embodiments, an oxide can fill into the seam of the cap film. Also, the magnetic hole photolithography and etching process can be self-aligned for magnetic film deposition, for example, by using the cap layer as a hardmask. In an embodiment, the magnetic film can be shape anisotropic to enhance the magnetic field inside the strips.

According to the exemplary embodiments, the process of etching back the oxide or the magnetic film to remove the top surface oxide or the magnetic film can remove the top magnetic film to make the magnetic strips more shape anisotropic and open a window for the top via connection.

According to the disclosed embodiments, the vertical magnetic anneal step (e.g., 826) can provide an important advantage with respect to the setup and alignment of the magnetic field inside the magnetic film (e.g., 316, 536) along a vertical direction of the magnetic film strips (i.e., the easy axis of the magnetic film strips). According to the disclosed embodiments, the whole inductor process can be added on or partially shared with the logic process or MRAM process.

According to the features of the disclosed embodiments, an integrated magnetic film enhanced inductor, and a method of forming an integrated magnetic film enhanced inductor, can be provided.

It will be appreciated that the inductor, as illustrated for example in FIGS. 4-8, may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Those of skill in the art will appreciate that the disclosed embodiments are not limited to illustrated exemplary structures or methods, and any means for performing the functionality described herein are included in the embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the disclosed embodiments may be described or claimed in the singular, the plural is contemplated unless limitation to the singular is explicitly stated.

What is claimed is:

1. An inductor comprising:
an inductor metal having a first portion and a second portion;
a cap layer comprising a top portion on top of at least one of the first portion or the second portion, and a sidewall portion in a space between sidewalls of the first portion and the second portion; and
a magnetic material comprising a plurality of magnetic film strips in holes in the top portion and the sidewall portion of the cap layer, wherein a vertical length of the magnetic material is greater than a vertical length of the sidewall of at least one of the first portion or the second portion of the inductor metal.

2. The inductor according to claim 1, wherein the magnetic material is a magnetic film.

3. The inductor according to claim 1, wherein a thickness of the magnetic material is selected to reduce an eddy current and a skin effect inside the magnetic material to reduce magnetic field loss.

4. The inductor according to claim 1, wherein the inductor is a serpent type inductor.

5. The inductor according to claim 1, wherein the inductor is a circular type inductor.

6. The inductor according to claim 1, further comprising:
a top metal or bottom metal coupled to the inductor metal.

7. The inductor according to claim 1, further comprising:
a circuit coupled to the inductor metal.

8. The inductor according to claim 1 integrated in at least one semiconductor die.

9. The inductor according to claim 1, further comprising an electronic device, selected from the group consisting of a set top box, music player, video player, entertainment unit, navigation device, communications device, personal digital assistant (PDA), fixed location data unit, and a computer, into which the inductor is integrated.

10. An inductor comprising:
a substrate;
an inductor metal having a plurality of turns on the substrate;
a cap layer comprising a top portion on top of at least one of the plurality of turns, and a sidewall portion in a space between adjacent turns of the plurality of turns; and
a magnetic material comprising a plurality of magnetic film strips in holes in the top portion and the sidewall portion of the cap layer, wherein a vertical length of the magnetic material is greater than a vertical length of the sidewall of at least one of the plurality of turns of the inductor metal.

11. The inductor according to claim 10, wherein the magnetic material is a magnetic film.

12. The inductor according to claim 10, wherein a thickness of the magnetic material is selected to reduce an eddy current and a skin effect inside the magnetic material to reduce magnetic field loss.

13. The inductor according to claim 10, wherein the inductor is a serpent type inductor.

14. The inductor according to claim 10, wherein the inductor is a circular type inductor.

15. The inductor according to claim 10, further comprising:
a top metal or a bottom metal coupled to the inductor metal.

16. The inductor according to claim 10, further comprising:
a circuit coupled to the inductor metal.

17. The inductor according to claim 10 integrated in at least one semiconductor die.

18. The inductor according to claim 10, further comprising an electronic device, selected from the group consisting of a set top box, music player, video player, entertainment unit, navigation device, communications device, personal digital assistant (PDA), fixed location data unit, and a computer, into which the inductor is integrated.

19. An inductor comprising:
inductive means for generating a magnetic field, the inductive means having a first portion and a second portion;
isolating means for magnetically isolating at least one of the first portion or the second portion of the inductive means, the isolating means comprising a top portion on top of at least one of the first portion or the second portion, and a sidewall portion in a space between sidewalls of the first portion and the second portion; and magnetic means for increasing inductance of the inductive means, in holes in the top portion and the sidewall portion of the isolating means, wherein a vertical length of the magnetic means is greater than a vertical length of the sidewall of at least one of the first portion or the second portion of the inductive means.

20. The inductor according to claim 19, wherein a thickness of the magnetic means is selected to reduce an eddy current and a skin effect inside the magnetic material to reduce magnetic field loss.

21. The inductor according to claim 19, wherein the inductor is a serpent type inductor.

22. The inductor according to claim 19, wherein the inductor is a circular type inductor.

23. The inductor according to claim 19, further comprising:

first and second electrode means for electrically connecting the inductor coupled to the inductive means.

24. The inductor according to claim 19 integrated in at least one semiconductor die.

25. The inductor according to claim 19, further comprising an electronic device, selected from the group consisting of a set top box, music player, video player, entertainment unit, navigation device, communications device, personal digital assistant (PDA), fixed location data unit, and a computer, into which the inductor is integrated.

\* \* \* \* \*